(12) United States Patent
Kim et al.

(10) Patent No.: US 7,635,547 B2
(45) Date of Patent: Dec. 22, 2009

(54) STENCIL MASK HAVING MAIN AND AUXILIARY STRUT AND METHOD OF FORMING THE SAME

(75) Inventors: In-Sung Kim, Seongnam-si (KR); Ho-Chul Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 46 days.

(21) Appl. No.: 12/114,946

(22) Filed: May 5, 2008

(65) Prior Publication Data

US 2008/0268353 A1    Oct. 30, 2008

Related U.S. Application Data

(62) Division of application No. 10/827,513, filed on Apr. 19, 2004, now Pat. No. 7,384,711.

(30) Foreign Application Priority Data

Jun. 27, 2003    (KR) ................................ 2003-42775

(51) Int. Cl.
*G03F 9/00*    (2006.01)
(52) U.S. Cl. ........................... 430/5; 430/296; 430/313; 430/314; 430/316; 430/317; 430/319; 430/320; 430/942
(58) Field of Classification Search ..................... 430/5, 430/296, 313, 314, 316, 317, 319, 320, 323, 430/324, 942
See application file for complete search history.

(56) References Cited

U.S. PATENT DOCUMENTS 6,459,090 B1    10/2002    Suzuki
7,384,711 B2 *   6/2008    Kim et al. ...................... 430/5

OTHER PUBLICATIONS

Office Action issued by the Chinese Patent Office on Jun. 5, 2009 during examination of the corresponding Chinese application No. 2004100598454.

* cited by examiner

*Primary Examiner*—Christopher G Young
(74) *Attorney, Agent, or Firm*—F. Chau & Assoc., LLC

(57) ABSTRACT

A stencil mask includes a membrane forming thin layer having membrane areas and a border area that limits the membrane areas. The membrane areas have a plurality of pattern areas which include an aperture through which particle beams can permeate and non-pattern areas interposed between the pattern areas. A main strut supports the membrane areas and is formed on the border area of the membrane forming thin layer. An auxiliary strut is formed in the non-pattern areas inside the membrane pattern area such that the auxiliary strut divides the membrane areas into plural divided membrane areas. The auxiliary strut supports the divided membrane areas.

36 Claims, 16 Drawing Sheets

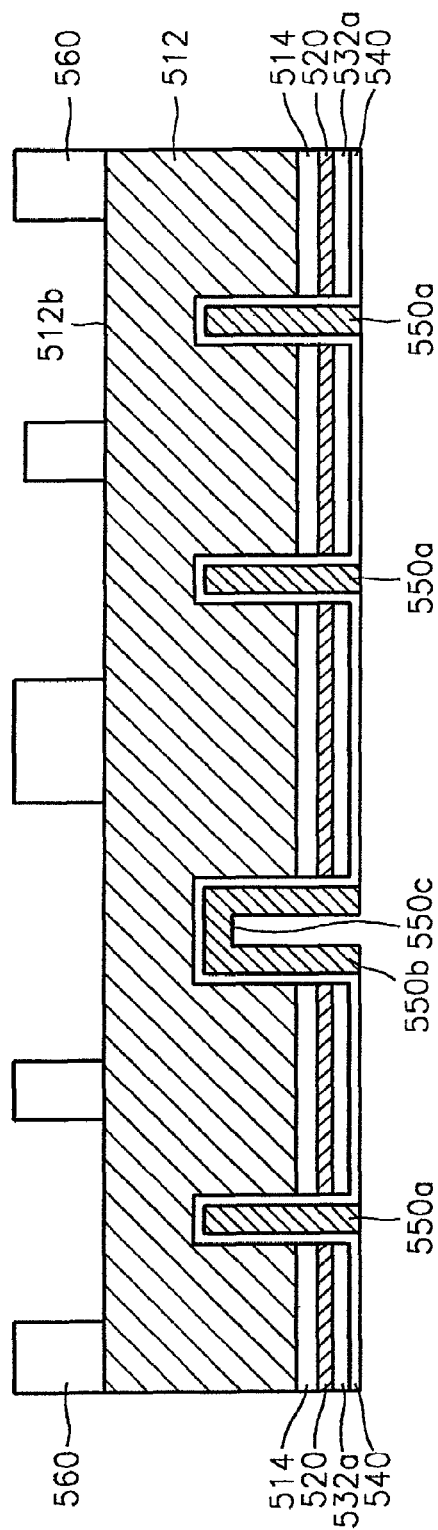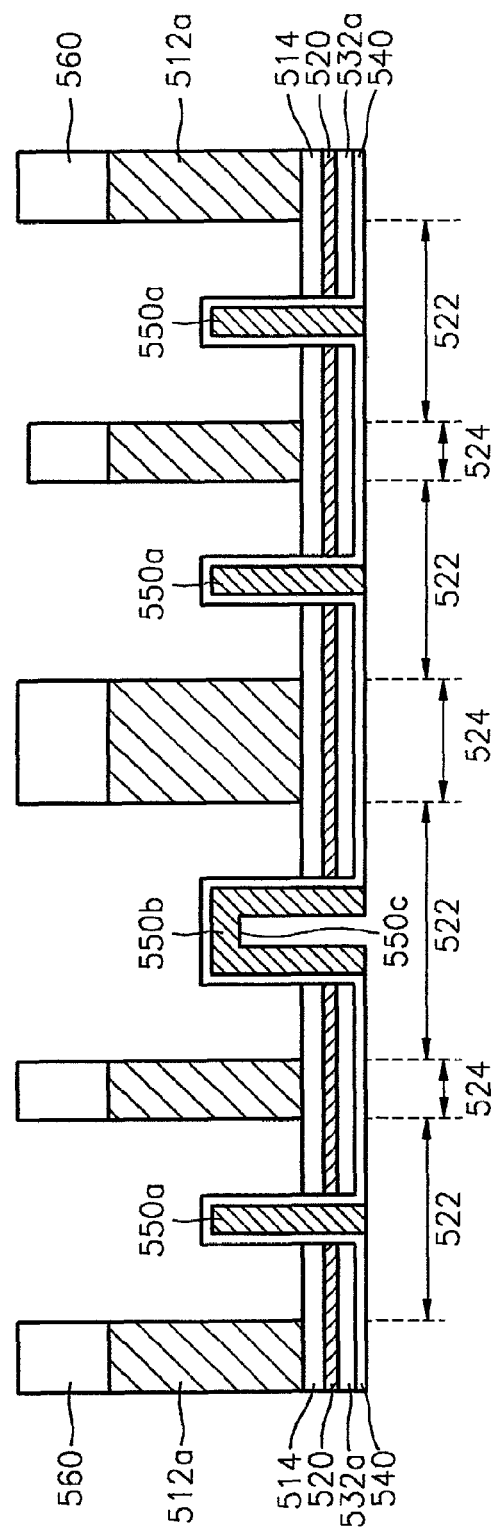

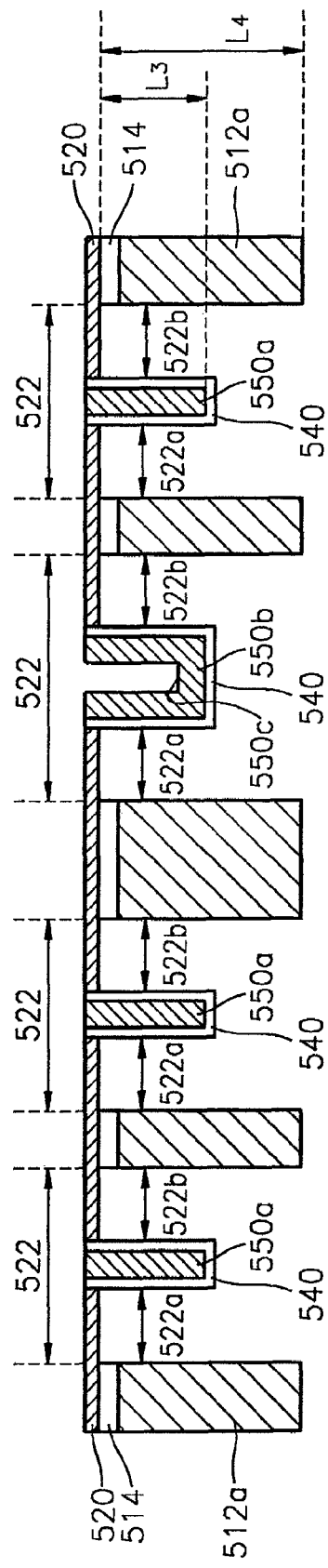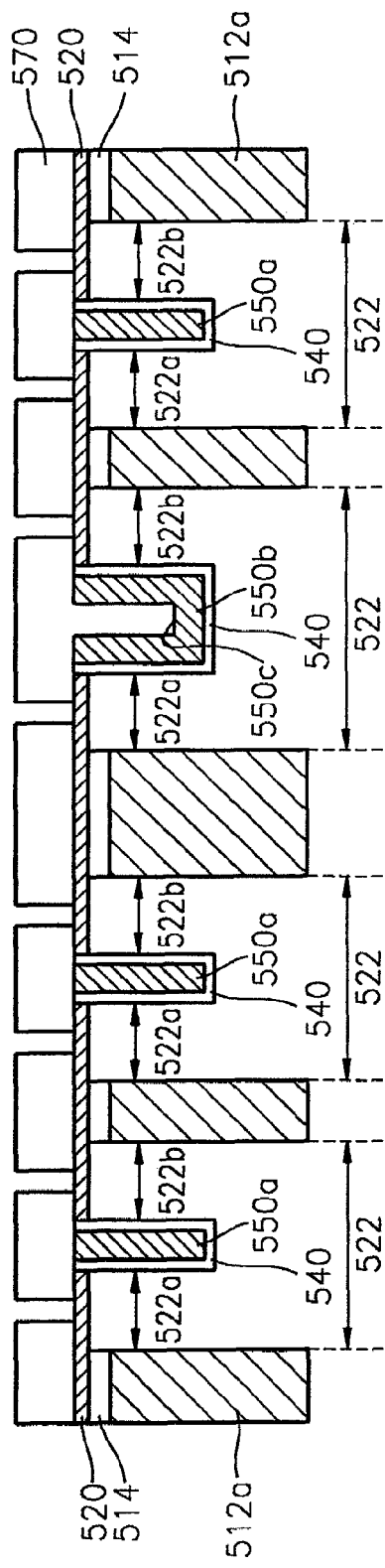

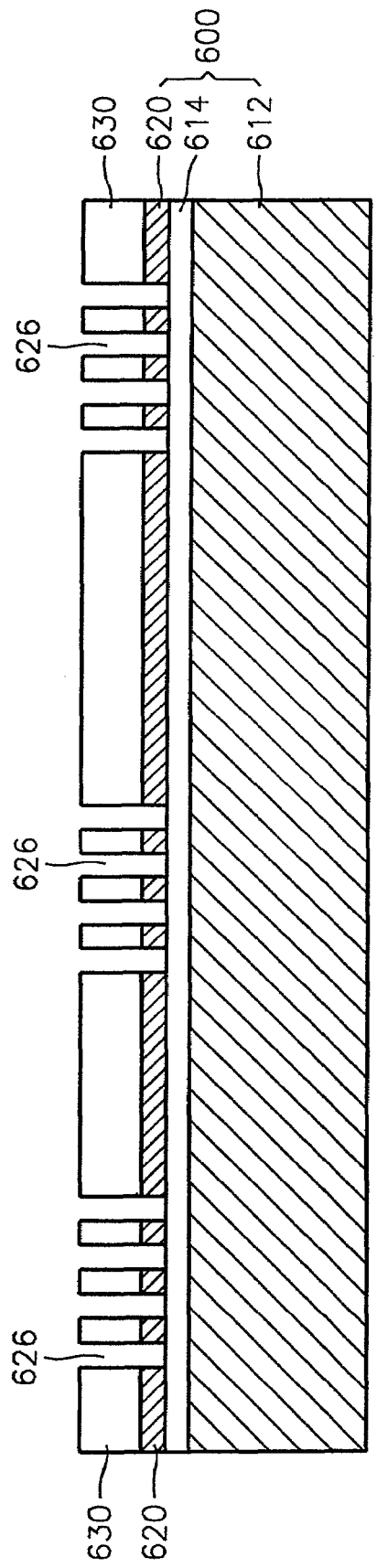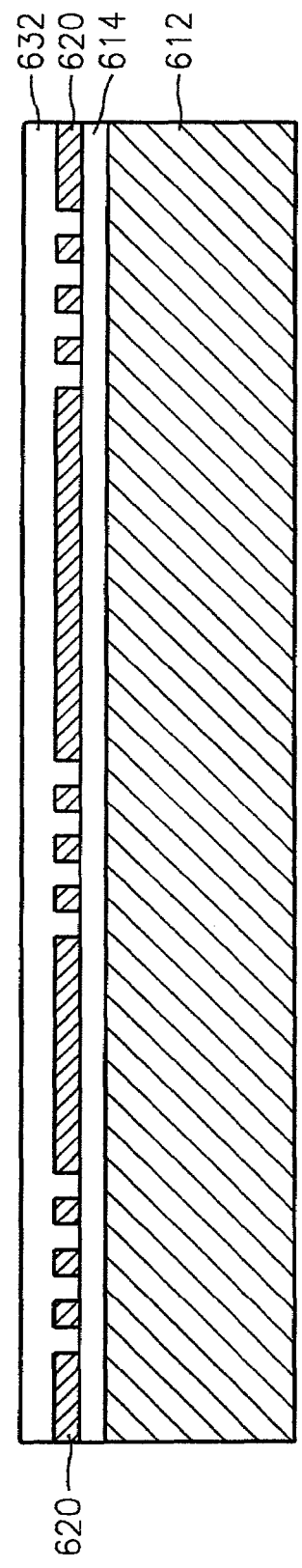

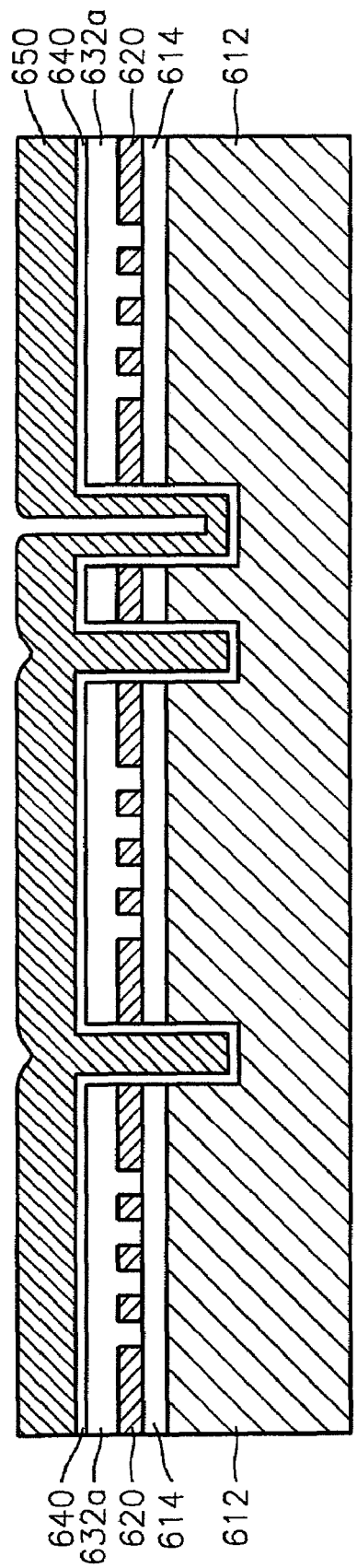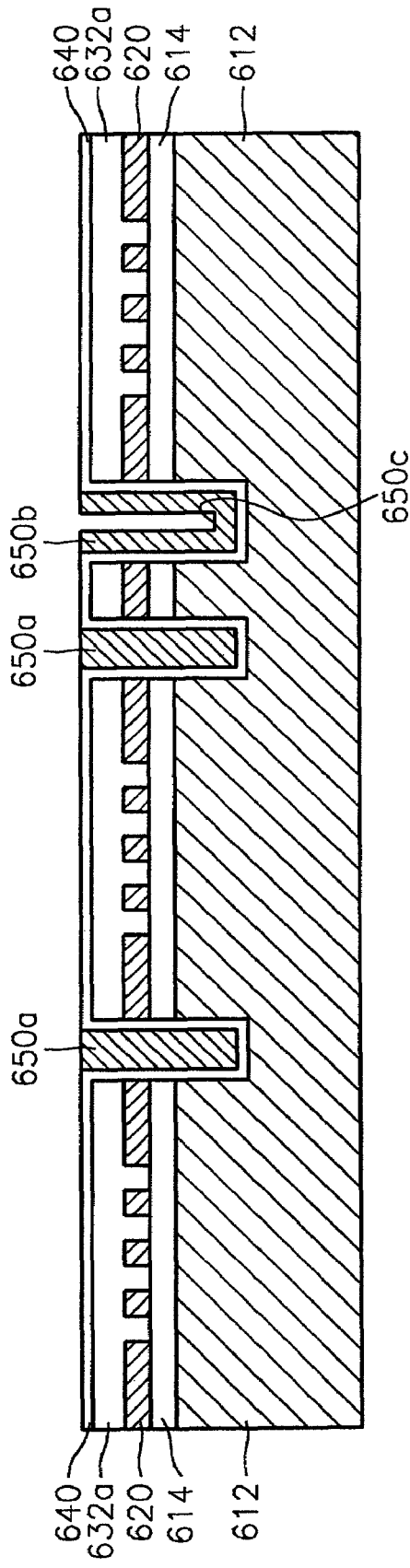

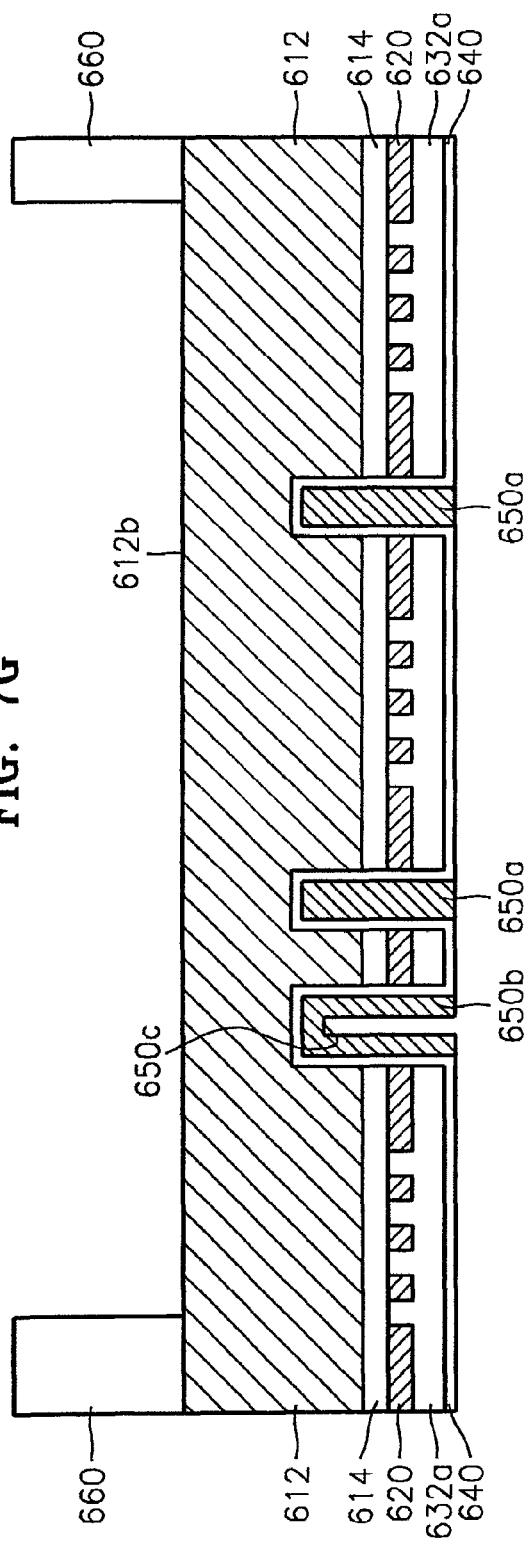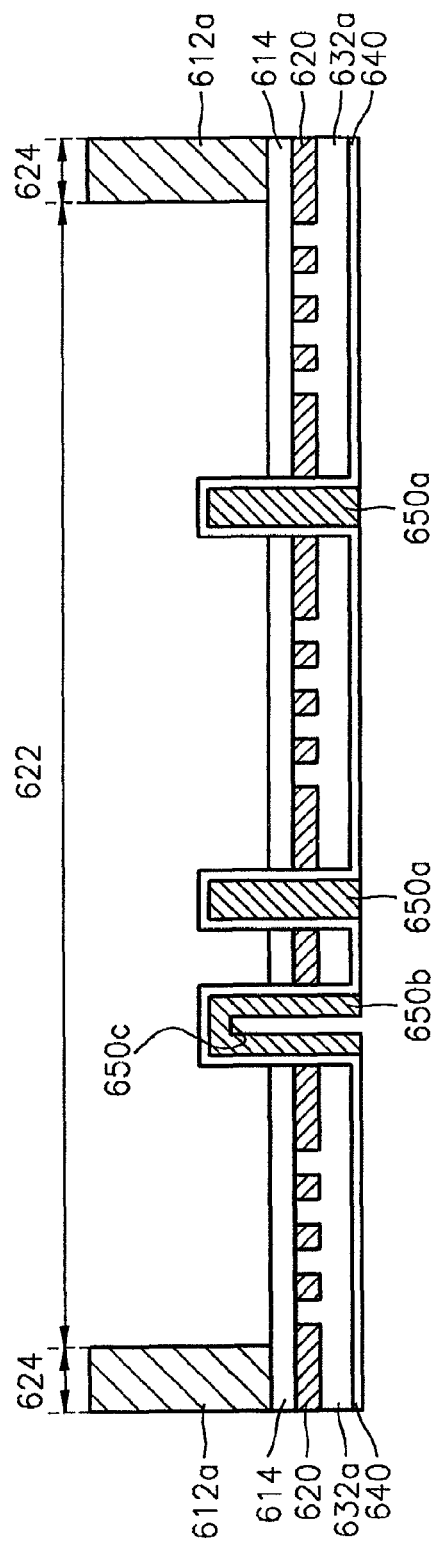

STENCIL MASK HAVING MAIN AND AUXILIARY STRUT AND METHOD OF FORMING THE SAME

CROSS-REFERENCE TO RELATED APPLICATIONS

This application is a divisional of application Ser. No. 10/827,513, filed Apr. 19, 2004, now U.S. Pat. No. 7,384,711 which claims priority to Korean Patent Application No. 2003-42775, filed on Jun. 27, 2003, the disclosures of which are incorporated herein by reference in their entirety.

BACKGROUND

1. Technical Field

The present disclosure relates to a stencil mask and a manufacturing method thereof, which is utilized for forming a pattern according to lithography technology using a charged particle beam such as an electron beam, and more particularly, to a stencil mask and a manufacturing method thereof using a thin film membrane supported by a strut.

2. Discussion of Related Art

As the design rule of semiconductor integrated circuit devices has decreased, lithography technologies utilizing a particle beam such as an X ray, an electron beam, and an ion beam have been developed to enhance resolution of optical instruments. Among the various types of lithography, electron beam projection lithography has an advantage of forming a fine pattern at a scale of 1 µm or less. Thus, various systems and pattern forming methods using this lithography technology have been proposed. One example is disclosed in U.S. Pat. No. 5,831,272.

Electron beam proximity projection lithography (EPL) and low energy electron beam proximity projection lithography (LEEPL) project a pattern onto a resist by permeation of the electron beam through a fine aperture formed on a stencil mask.

FIG. 1 is a perspective view of a partial composition of a conventional stencil mask 10 used in EPL or LEEPL. Referring to FIG. 1, the conventional stencil mask has a plurality of membrane areas 12 respectively patterned by a fine aperture (not shown) and divided by border areas, which are not patterned. The border areas include support struts 14 which are formed of rows and columns, which intersect perpendicularly and reinforce mechanical durability of the stencil mask 10.

FIG. 2 is a cross-section illustrating a portion of the stencil mask 10 of FIG. 1. Referring to FIG. 2, apertures 12a corresponding to fine patterns are formed in the membrane areas 12. If electron beams 20 are projected onto the stencil mask 10, the fine pattern is projected onto a resist layer (not shown) coated on a wafer after the electron beams permeate the apertures 12a.

The apertures 12a are formed by etching the membrane areas 12. In a case where the fine pattern is used for manufacturing a next generation highly integrated device, for example, when the fine pattern at a scale of 0.1 µm or less is required, the apertures 12a must be formed to have a line width on a scale of 10's of nm. In this case, the ratio of the thickness of the membrane areas 12 to the diameter of the apertures 12a, i.e. the aspect ratio of the apertures 12a, should be small enough to accurately form a desired profile of the apertures 12a during etching of the membrane areas 12. Specifically, the aspect ratio of the apertures 12a must be reasonably maintained and the thickness of the membrane areas 12 should be as thin as possible, for instance, at about 1 µm or less and preferably 500 nm or less.

However, thin membrane areas 12 bend easily, resulting in a tensile stress inside the membrane areas 12. The tensile stress causes the membrane areas 12 to transform or distort, and thus image placement error occurs since the pattern projected through the membrane areas 12 becomes displaced.

Various mask structures have been suggested to solve the above problems, such as U.S. Pat. No. 6,261,726 B1 and Japanese Patent Publication No. hei 15(2003)-59819. However, these masks, which include a structure to support the membrane, mostly use the conventional strut structure described above and thus have limitations in preventing image placement error due to the transformation or distortion of the membrane. Accordingly, there is a need for a stencil mask in which occurrence of image placement error due to transformation or distortion induced by internal stress inside membrane areas is substantially diminished without limiting size or aspect ratio of the membrane areas.

SUMMARY OF THE INVENTION

A stencil mask according to an embodiment of the invention includes a membrane forming thin layer having membrane areas and a border area that limits the membrane areas. The membrane areas include a plurality of pattern areas in which a plurality of apertures that allow permeation of particle beams is formed, and a plurality of non-pattern areas placed between the plurality of pattern areas. A main strut is formed on the border area of the membrane forming thin layer to support the membrane areas. An auxiliary strut is formed on the non-pattern areas inside the membrane areas. The auxiliary strut divides the membrane areas into a plurality of divided membrane areas and supports each divided membrane area.

In at least one embodiment of the invention, the auxiliary strut penetrates the membrane forming thin layer. The membrane forming thin layer comprises a first side opposing the main strut and a second side opposite the first side, and the second side of the membrane forming thin layer exposes a first surface of the auxiliary strut. In addition, the auxiliary strut extends by a first length from the first side of the membrane forming thin layer and the first length is shorter than a length of the main strut. Preferably, the auxiliary strut overlaps the border area and the main strut.

The stencil mask according to an embodiment of the present invention may further comprise a protection layer partially covering the auxiliary strut. The protection layer does not cover the first surface of the auxiliary strut.

A method of manufacturing a stencil mask according to an embodiment of the invention includes preparing a composite layer, the composite layer including a membrane forming thin layer having a first side and a second side opposite the first side. The membrane forming thin layer also includes a plurality of membrane areas each having a plurality of pattern areas for forming a pattern to be projected by particle beams and non-pattern areas placed between each pattern area, the non-pattern areas including a border area limiting the membrane areas. The composite layer also include a substrate having a first side facing the first side of the membrane forming thin layer and a second side opposite the first side, and an oxide layer interposed between the first side of the membrane forming thin layer and the first side of the substrate. A trench is formed by etching the composite layer in the non-pattern areas from the second side of the membrane forming thin layer. An auxiliary strut is formed by filling a support layer inside the trench, and a main strut supporting the membrane areas is formed in the border area by removing sections of the substrate included in the membrane areas.

In at least one embodiment of the invention, the main strut is formed after forming the auxiliary strut. The step of forming an auxiliary strut may further include forming a protection layer on the inside walls of the trench, and forming the support layer on the protection layer.

At least one embodiment of the invention further includes a step of forming an aperture, which penetrates the membrane forming thin layer to form a projected pattern on the pattern areas of the membrane areas. The step of forming an aperture may be performed after or before forming the main and auxiliary struts.

A method of manufacturing a stencil mask according to another embodiment of the invention includes preparing a silicon on insulator (SOI) substrate by layering sequentially a substrate, an oxide layer and a silicon thin film. A first mask pattern is formed over the silicon thin film, and a trench is formed by etching the silicon thin film, the oxide layer, and the substrate using the first mask pattern as an etching mask. An auxiliary strut is formed by filling the trench with a support layer. A second mask pattern is formed on a surface of the substrate which is opposite to a surface of the substrate which contacts the oxide layer, and a main strut which limits the membrane area of the silicon thin film is formed by etching the substrate using the second mask pattern as an etching mask. An aperture is formed which penetrates the silicon thin film to form a projected pattern inside a pattern area limited by the auxiliary strut in the membrane area.

A method of manufacturing a stencil mask according to another embodiment of the invention includes preparing a silicon on insulator (SOI) substrate by layering sequentially a substrate, an oxide layer, and a silicon thin film. A border area is arranged which limits plural membrane areas that have pattern areas and non-pattern areas, which are, placed between the pattern areas in the silicon thin film. An aperture is formed which penetrates the silicon thin film to form a projected pattern in the pattern areas. A first mask pattern is formed which covers the pattern areas having the aperture and the border area and exposes the silicon thin film in the non-pattern areas. A trench is formed by etching the silicon thin film, the oxide layer and the substrate using the first mask pattern as an etching mask, in the non-pattern areas. An auxiliary strut is formed by filling the trench with a support layer. A second mask pattern is formed on a surface of the substrate which is opposite to a surface of the substrate which contacts the oxide layer, and a main strut which limits the membrane areas is formed in the border area by etching the substrate using the second mask pattern as an etching mask.

BRIEF DESCRIPTION OF THE DRAWINGS

The present invention will become more apparent by describing in detail exemplary embodiments thereof with reference to the attached drawings in which:

FIGS. 6A through 6I are cross-sections illustrating a method of manufacturing a stencil mask according to an embodiment of the present invention; and FIGS. 7A through 7I are cross-sections illustrating a method of manufacturing a stencil mask according to another embodiment of the present invention.

DESCRIPTION OF PREFERRED EMBODIMENTS

Various exemplary embodiments of the present invention will now be described more fully with reference to the attached drawings.

Figure 1:
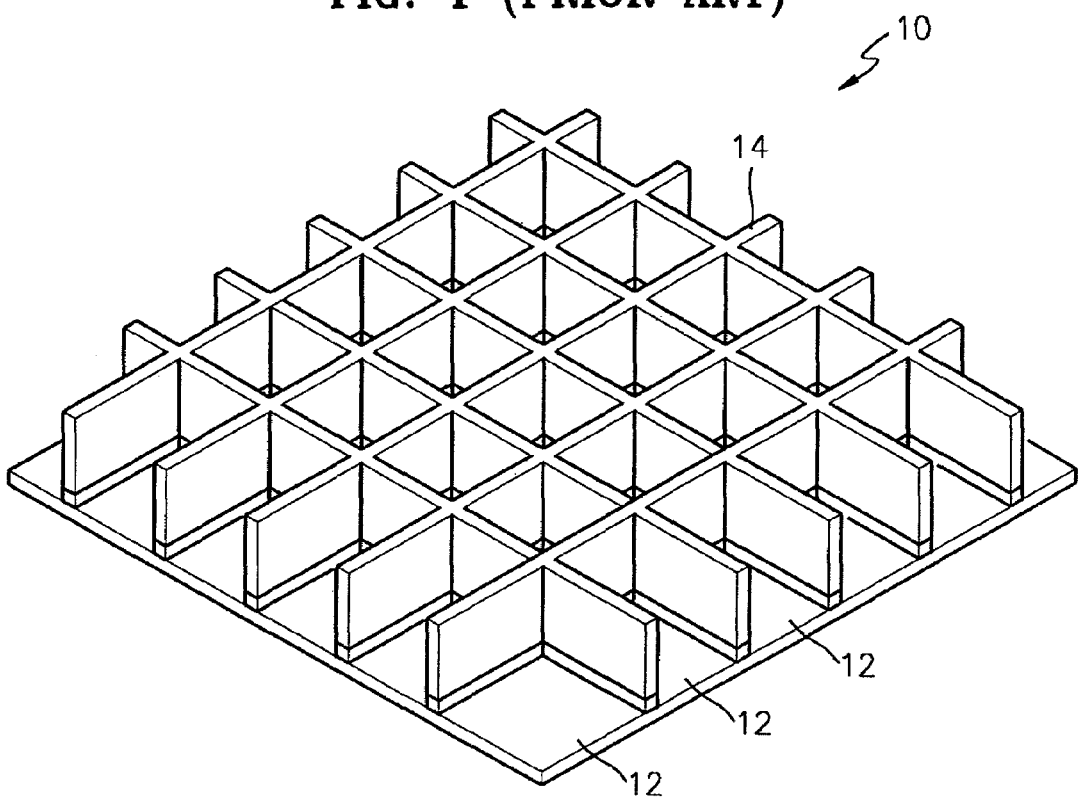
FIG. 1 is a perspective view of a partial construction of a conventional stencil mask.
Figure 2:
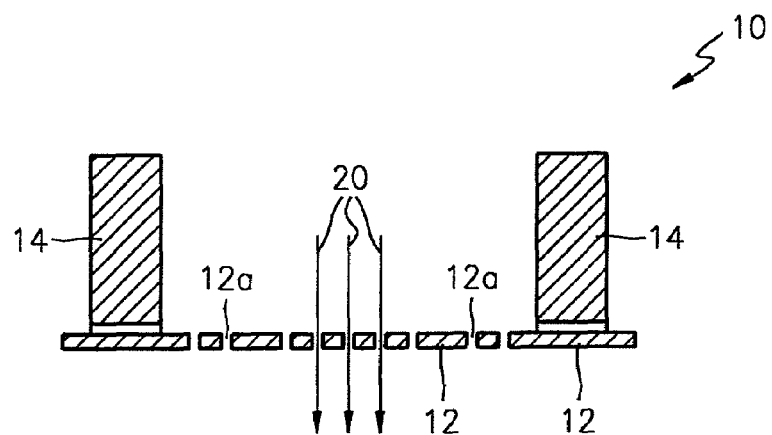
FIG. 2 is a fragmentary enlarged sectional view of the stencil mask of FIG. 1.
Figure 3A:
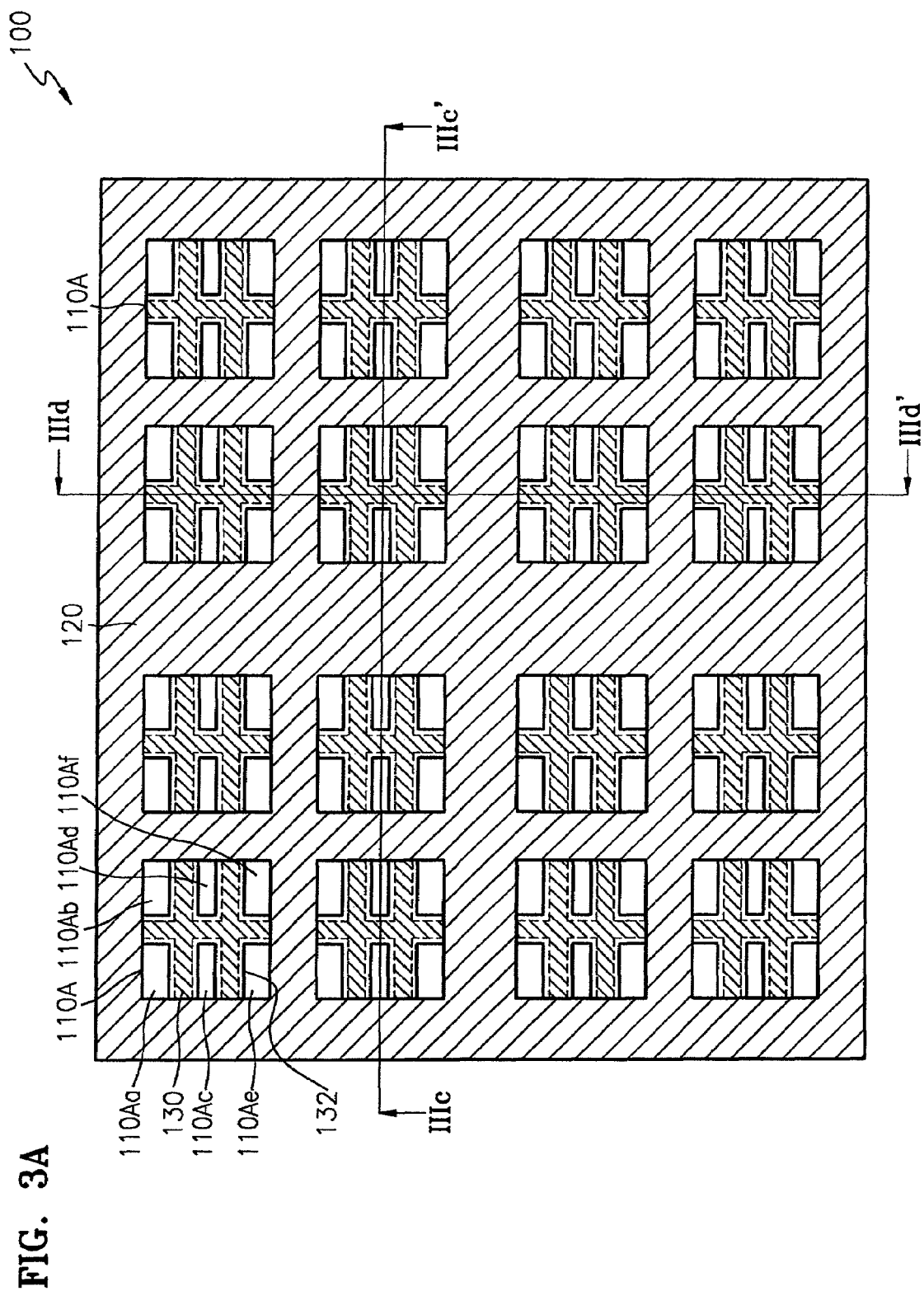
FIG. 3A is a top plan view of a stencil mask according to an embodiment of the present invention.
Figure 3B:
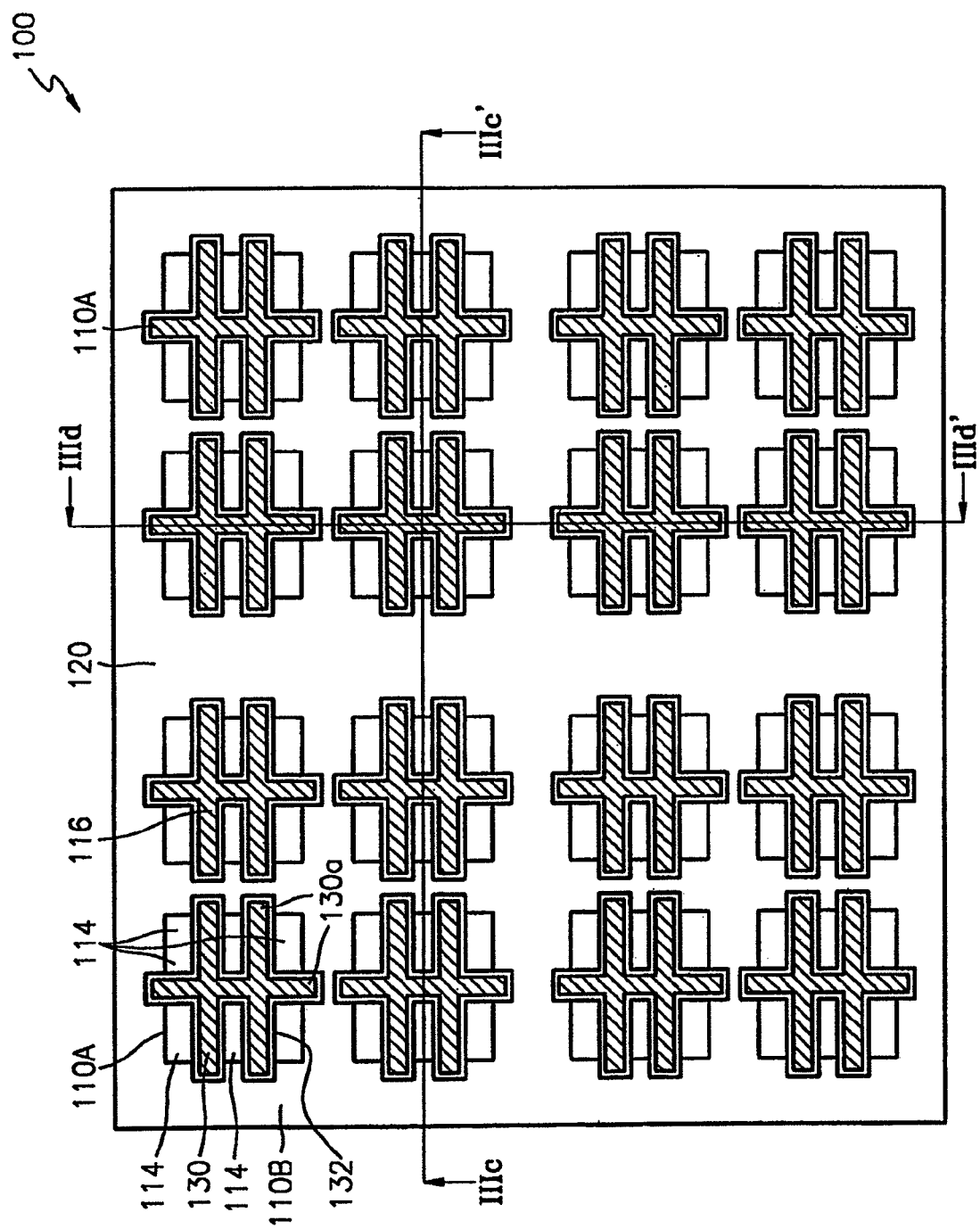
FIG. 3B is a bottom plan view of the stencil mask of FIG. 3A.
Figure 3C:
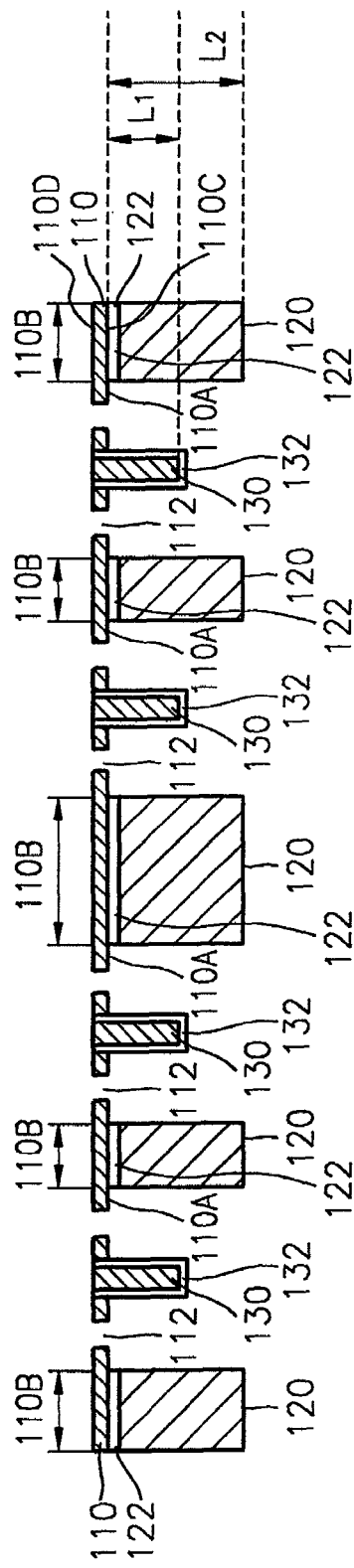
FIG. 3C is a cross section of the stencil mask of FIGS. 3A and 3B along a line IIIc-IIIc' of FIGS. 3A and 3B.
Figure 3D:
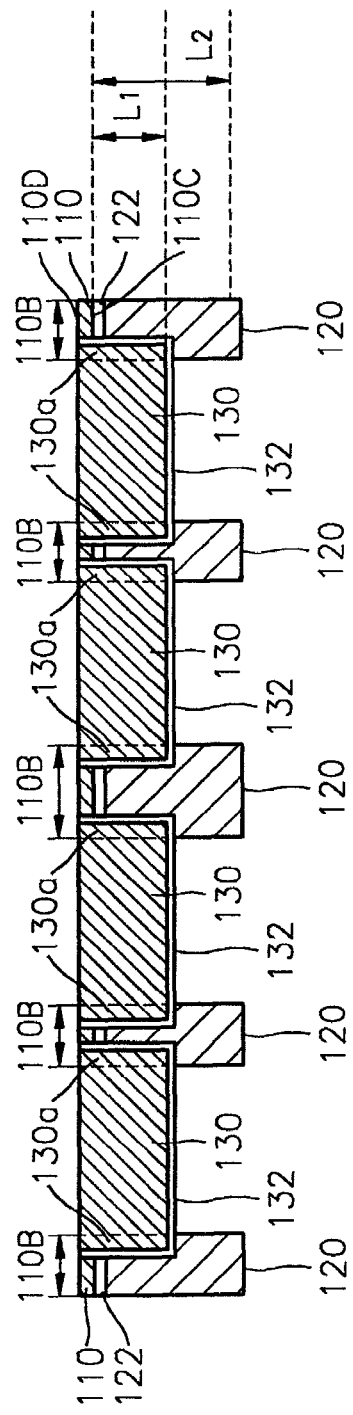
FIG. 3D is a cross section of the stencil mask of FIGS. 3A and 3B along a line IIId-IIId' of FIGS. 3A and 3B.

FIG. 3A is a top plan view of a stencil mask 100 according to an embodiment of the invention. FIG. 3B is a bottom plan view of the stencil mask 100. FIG. 3C is a cross-section of the stencil mask 100 along a line IIIc-IIIc' of FIGS. 3A and 3B. FIG. 3D is a cross-section of the stencil mask 100 along a line IIId-IIId' of FIG. 3A and FIG. 3B.

Referring to FIGS. 3A through 3D, the stencil mask 100 includes a membrane forming thin layer 110, which includes a plurality of membrane areas 110A and border areas 110B, which limit the membrane areas 110A. The size of each of the membrane areas 110A is respectively limited by a main strut 120 formed on the border areas 110B of the membrane forming thin layer 110. For instance, each membrane area 110A forms one chip area unit. The membrane forming thin layer 110 has a first side 110C facing the main strut 120 and a second side 110D on the opposite side of membrane forming thin layer 110. The first side 110C of the membrane forming thin layer 110 is observed in FIG. 3A and the second side 110D of the membrane forming thin layer 110 is observed in FIG. 3B.

Referring to FIGS. 3C and 3D, an oxide layer 122 is interposed between the border area 110B of the membrane forming thin layer 110 and the main strut 120.

Each of the membrane areas 110A has a plurality of pattern areas 114 in each of which an aperture 112 is formed, allowing particle beams (for example, electron beams) to permeate, and non-pattern areas 116 located between the pattern areas 114. An auxiliary strut 130 is formed on the non-pattern areas 116 to divide each membrane area 110A into a plurality of divided membrane areas 110Aa, 110Ab, 110Ac, 110Ad, 110Ae, and 110Af and support the divided membrane areas 110Aa, 110Ab, 110Ac, 110Ad, 110Ae, and 110Af. The divided membrane areas 110Aa, 110Ab, 110Ac, 110Ad, 110Ae, and 110Af are supported by the auxiliary strut 130, so that the pattern areas 114 may be respectively made up of a cellblock unit in which a unit cell pattern of a semiconductor memory device is clustered. In the case of the semiconductor memory device, the cell blocks are arranged in a cell type array, with a distance of about 10~100 μm. between adjacent cell blocks, and the cell arrays are separated by peripheral circuit regions with a width of about 100 μm or more. If each of the membrane areas 110A is formed to correspond to a cell array, the distance between each cellblock inside the cell array corresponds to the width of the non-pattern areas 116 placed inside each membrane area 110A. Thus, the auxiliary strut 130 is formed in the non-pattern areas 116 having a width of about 10~100 µm. Moreover, the membrane areas 110A are separated by the border areas 110B, which have a width of about 100 µm or more. The membrane forming thin layer 110 may be made of a silicon layer. The auxiliary strut 130 is preferably formed of a material having similar stress characteristics to that of the membrane forming thin layer 110. For instance, the auxiliary strut 130 may be made of a polisilicon layer, a TiN layer, a Ti layer, or a combination layer of at least two of these three materials. The auxiliary strut 130 has a columnar shape and is preferably solid in cross section.

Referring to FIGS. 3A, 3B, and 3D, the auxiliary strut 130 is formed to penetrate the membrane forming thin layer 110, and thus, it is exposed through the second side 110D of the membrane forming thin layer 110. Furthermore, the auxiliary strut 130 has overlap portions 130a, which extend over the border area 110B of the membrane forming thin layer 110 to partly overlap the main strut 120.

The auxiliary strut 130 extends a first length $L_1$ into the main strut 120, and the first length $L_1$ is shorter than the length $L_2$ of the main strut 120.

The auxiliary strut 130 is covered with a protection layer 132 excluding the side corresponding to the second side 110D of the membrane forming thin layer 110. The protection layer 132 is formed of a material that protects the auxiliary strut 130 during an etching process for forming the main strut 120, which is performed after formation of the auxiliary strut 130. For example, if the auxiliary strut 130 is formed of a polisilicon layer, the protection layer 132 is preferably made of a Ti layer, a TiN layer, a silicon nitride layer, or a combination thereof. In other embodiments of the invention, the protection layer 132 may be omitted if a sufficiently large etching selectivity difference exists between the main strut 120 and the auxiliary strut 130. For example, the protection layer 132 may be omitted if the main strut 120 is made of a silicon layer and the auxiliary strut 130 is made of a TiN or a Ti layer.

As described above, each membrane area 110A is divided into the plurality of divided membrane areas 110Aa, 110Ab, 110Ac, 110Ad, 110Ae, and 110Af corresponding to the plurality of pattern areas 114 formed by the cell block unit, and the respective divided membrane areas 110Aa, 110Ab, 110Ac, 110Ad, 110Ae, and 110Af are supported by the auxiliary strut 130 formed in the non-pattern areas 116 inside each membrane area 110A. Accordingly, it is not necessary to limit the shape and size of the main strut 120 as well as the size and aspect ratio of the membrane areas 110A. In addition, although the shape of the conventional stencil mask is restricted to that of a square lattice, the membrane areas 110A can have a variety of shapes corresponding to various circuit patterns according to the layout of the semiconductor device, which is being formed. Also, a customized stencil mask can be manufactured fitting various chip designs since the placement, width, and length of the auxiliary strut 130 can be designed in various ways according to the layout of the semiconductor or logic device.

The auxiliary strut 130 of the stencil mask according to the present embodiment of the invention is enclosed by the protection layer 132 and has a solid cross sectional shape. However, the stencil mask according to various exemplary embodiments of the present invention is not limited to this configuration.

Figure 4A:
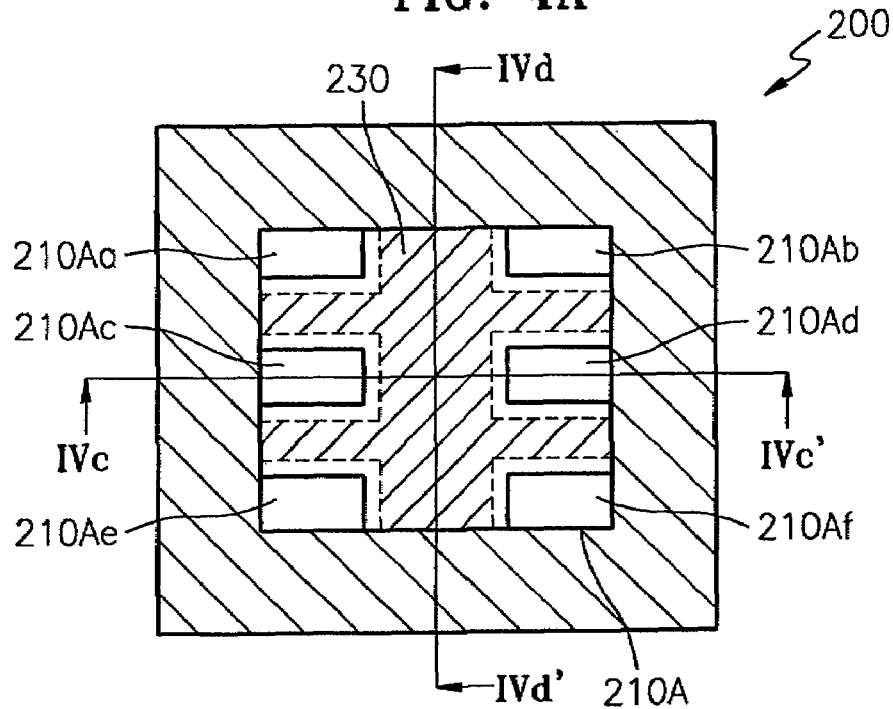
FIG. 4A is a top plan view of a stencil mask according to another embodiment of the present invention.
Figure 4B:
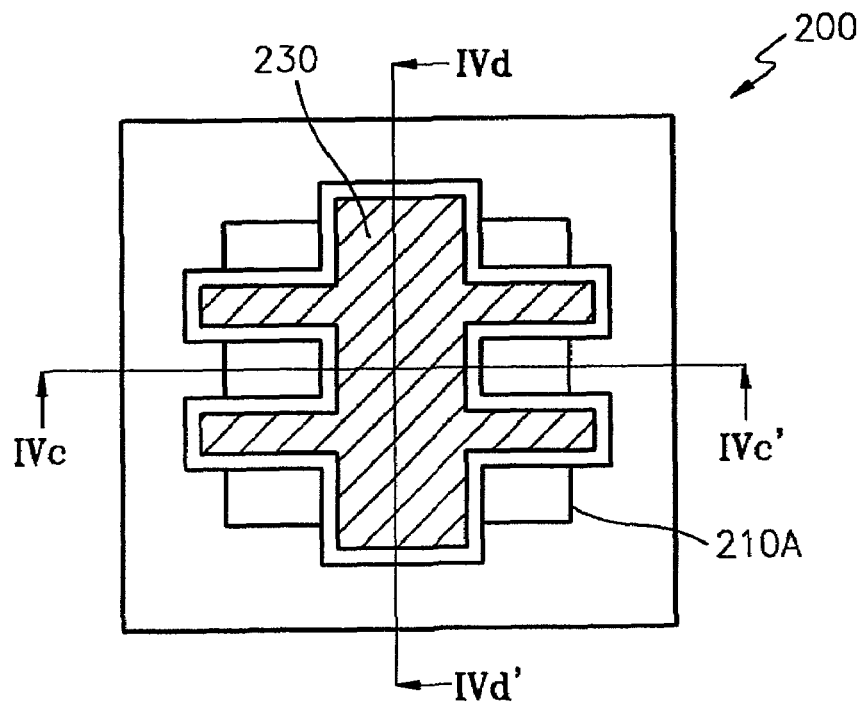
FIG. 4B is a bottom plan view of the stencil mask of FIG. 4A.
Figure 4C:
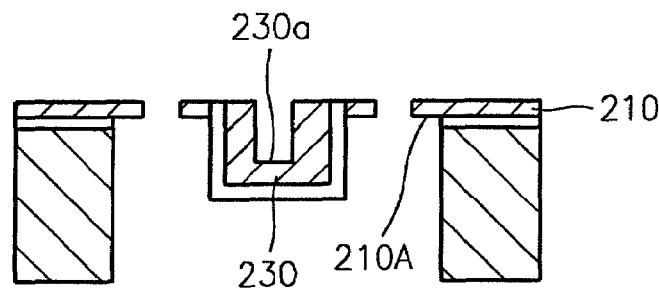
FIG. 4C is a cross section of the stencil mask of FIGS. 4A and 4B along a line IVc-IVc' of FIGS. 4A and 4B.
Figure 4D:
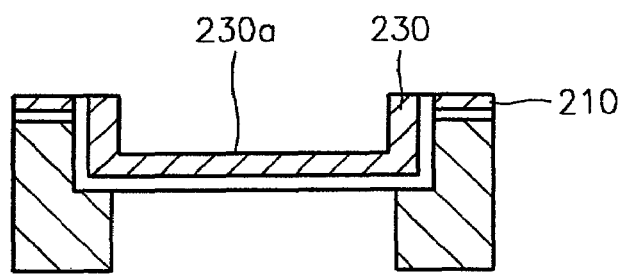
FIG. 4D is a cross section of the stencil mask of FIGS. 4A and 4B along a line IVd-IVd' of FIGS. 4A and 4B.

FIGS. 4A through 4D illustrate a stencil mask 200 according to another embodiment of the present invention. FIG. 4A is a top plan view of the stencil mask 200 and FIG. 4B is a bottom plan view of the stencil mask 200. FIG. 4C is a cross-section of the stencil mask 200 along a line IVc-IVc' of FIGS. 4A and 4B. FIG. 4D is a cross-section of the stencil mask 200 along a line IVd-IVd' of FIGS. 4A and 4B.

Referring to FIGS. 4A through 4D, the stencil mask 200 according to the present embodiment of the invention includes an auxiliary strut 230, which has a "U" shape. The auxiliary strut 230 divides a membrane area 210A of a membrane forming thin layer 210 into a plurality of divided membrane areas 210Aa, 210Ab, 210Ac, 210Ad, 210Ae, and 210Af and supports these divided membrane areas. In this case, part of the surface of the auxiliary strut 230 exposed through the membrane forming thin layer 210 is recessed. Except for the auxiliary strut 230, the stencil mask 200 is identical to the stencil mask 100 of the previous embodiment.

Figure 5:
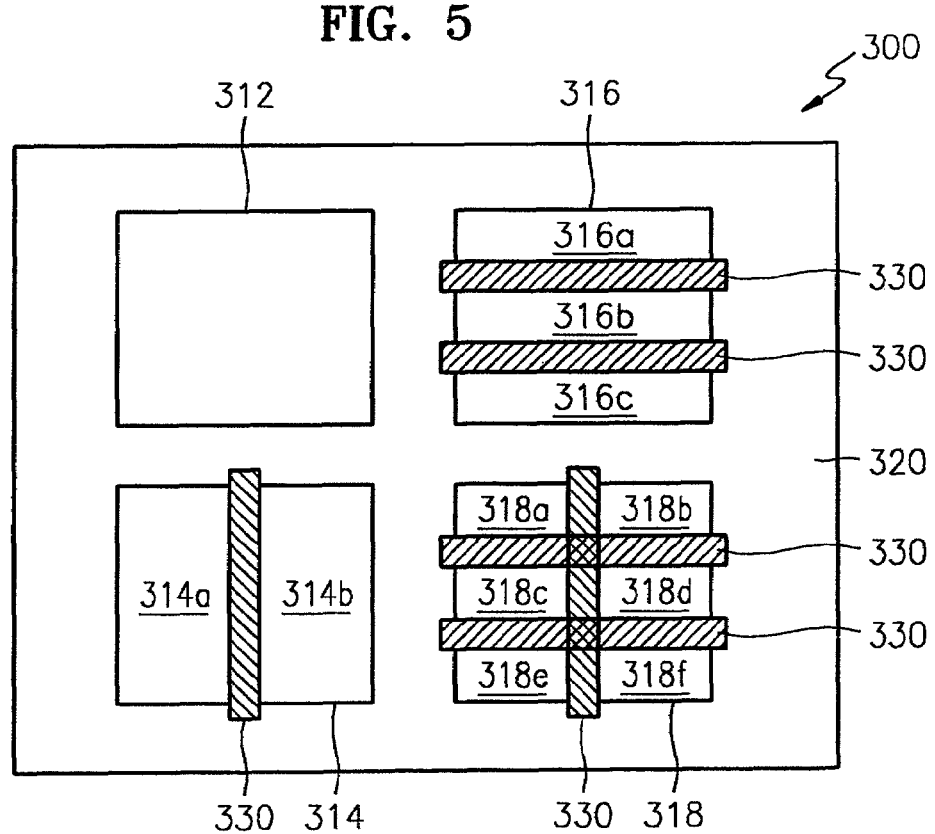
FIG. 5 is a plan view of a stencil mask according to another embodiment of the present invention.

FIG. 5 illustrates a stencil mask 300 according to another embodiment of the present invention. The stencil mask 300 includes membrane areas 312, 314, 316 and 318 divided into a plurality of divided membrane areas 314a, 314b, 316a, 316b, 316c, 318a, 318b, 318c, 318d, 318e, and 318f supported by auxiliary struts 330 having various shapes and placements. The auxiliary strut 330 may be formed of various shapes such as a lined pattern or a lined and spaced pattern as required by the semiconductor device design.

FIGS. 6A through 6I are cross-sections illustrating a method of manufacturing a stencil mask according to an embodiment of the present invention.

Figure 6A:
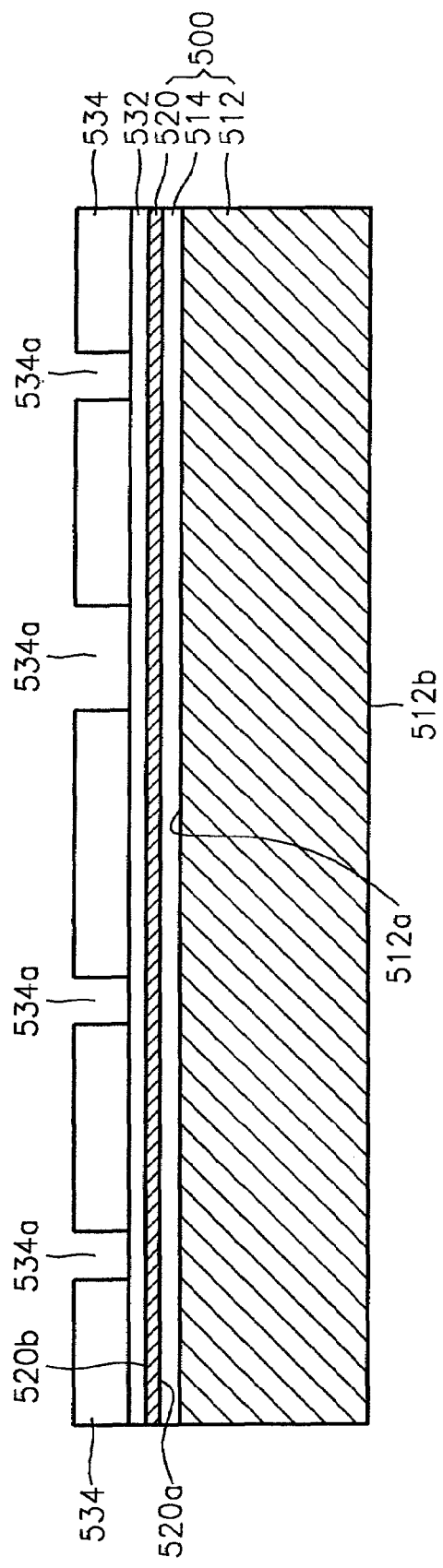

Referring to FIG. 6A, a composite layer 500 is prepared by sequentially forming an oxide layer 514 and a membrane forming thin layer 520 on a substrate 512. A silicon on insulator (SOI) substrate in which the substrate 512 is made of silicon and the membrane forming thin layer 520 is formed of a silicon thin film may be used as the composite layer 500.

The membrane forming thin layer 520 has a first side 520a, which faces the substrate 512, and a second side 520b on the opposite side of the membrane forming thin layer 520. Moreover, the substrate 512 has a first side 512a, which faces the membrane forming thin layer 520, and a second side 512b on the opposite side of the first side 512a. The oxide layer 514 is interposed between the first side 520a of the membrane forming thin layer 520 and the first side 512a of the substrate 512.

A hard mask layer 532 made of a silicon nitride layer or a silicon oxide layer is formed on the membrane forming thin layer 520 of the composite layer 500 and a photoresist pattern 534 is formed on the hard mask layer 532. The photoresist pattern 534 exposes the hard mask layer 532 through apertures 534a having various widths ranging between about 10~100 µm. The apertures 532a may have a lined pattern or a lined and spaced pattern.

Figure 6B:
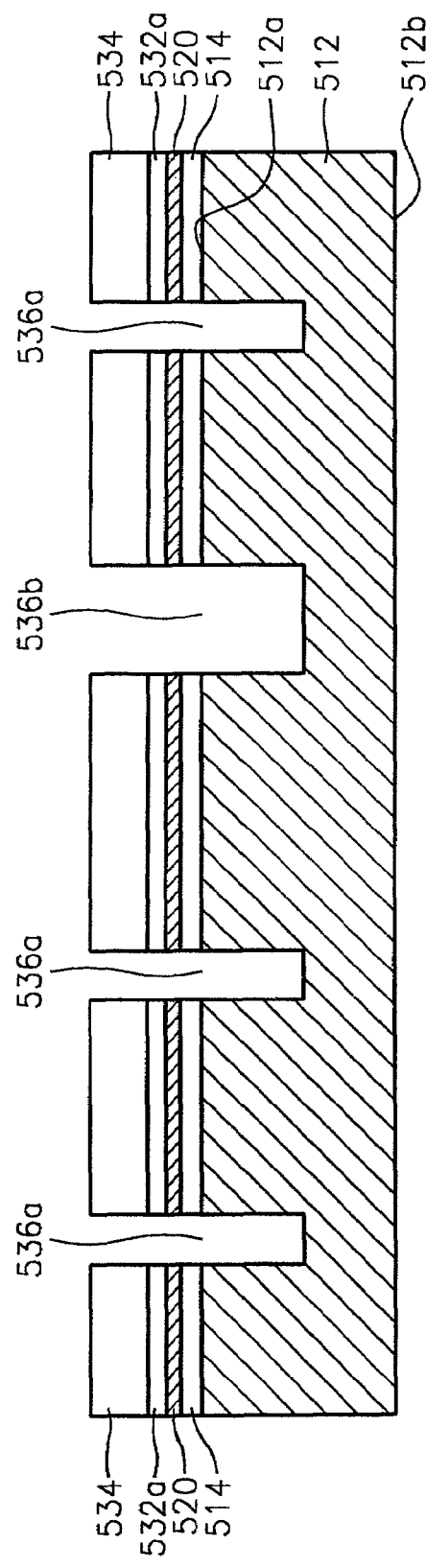

Referring to FIG. 6B, a hard mask pattern 532a exposing the membrane forming thin layer 520 is formed by etching the hard mask layer 532 using the photoresist pattern 534 as an etching mask. Thereafter, trenches 536a and 536b having various widths ranging between about 10~100 µm are formed in the substrate 512 by etching the membrane forming thin layer 520, the oxide layer 514, and the substrate 512 using the hard mask pattern 532a and the photoresist pattern 534 as the etching mask. The trenches 536a and 536b do not completely penetrate the substrate 512.

Figure 6C:
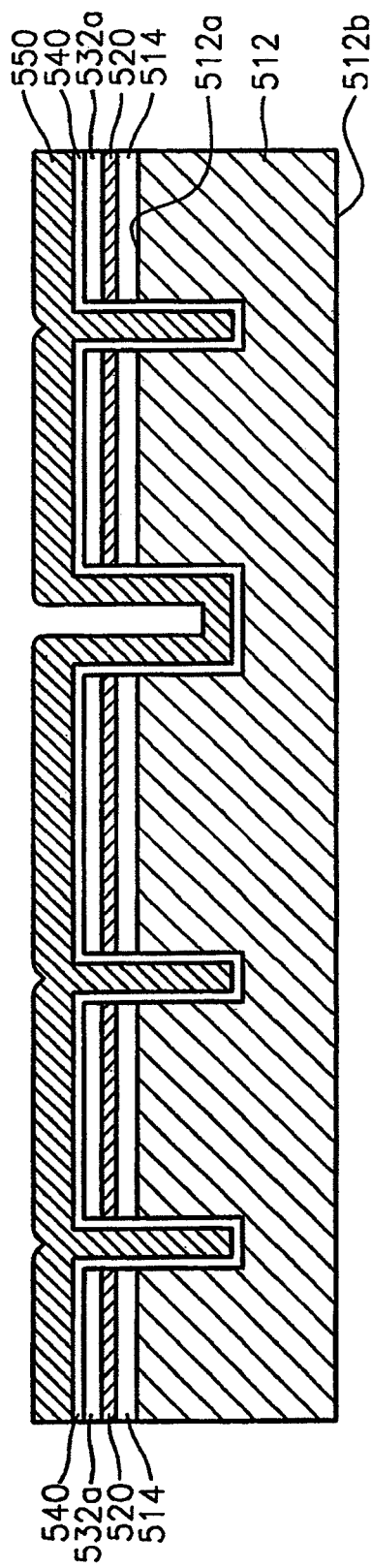

Referring to FIG. 6C, after removing the photoresist pattern 534, a protection layer 540 is formed on the inside walls of the trenches 536a and 536b and an upper surface of the hard mask pattern 532a, and a support layer 550 is formed on the surface of the protection layer 540 to fill the trenches 536a and 536b.

The protection layer 540 protects the support layer 550 when etching the substrate 512 in a subsequent process and may be formed of a Ti layer, a TiN layer, a silicon nitride layer or a combination layer made of two or more of these three materials. The support layer 550 is necessary for forming the auxiliary strut and may be formed of a polisilicon layer, a TiN layer, a Ti layer, or a combination layer made of two or more of these three materials. In the case where the support layer 550 is made of a TiN layer, a Ti layer, or a combination thereof, the protection layer 540 may be omitted.

In addition, the trench 536a having a relatively small width is completely filled in by the support layer 550 and the trench 536b having a relatively large width is partially filled in by the support layer 550.

Figure 6D:
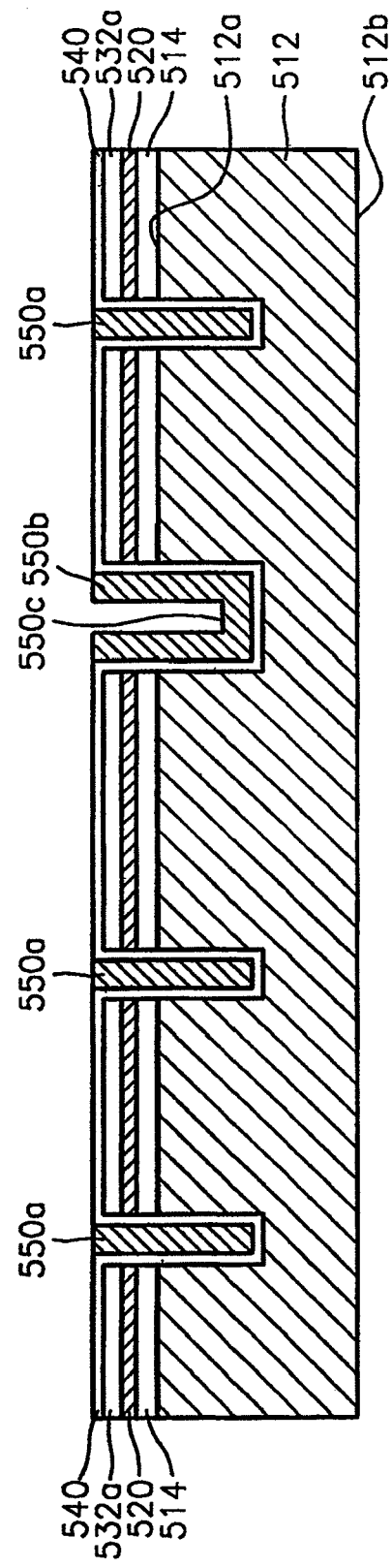

Referring to FIG. 6D, support layer patterns 550a and 550b composing the auxiliary strut inside the trenches 536a and 536b are formed by removing the support layer 550 at the outside of the trenches 536a and 536b using chemical mechanical polishing (CMP) or etchback methods. As a result, a support layer pattern 550a completely filling the inside of the trench 536a gives the auxiliary strut a columnar shape, and a support layer pattern 550b having part of its surface 550c recessed gives the auxiliary strut a U-shape.

If the etchback method is used to remove the support layer 550 at the outside of the trenches 536a and 536b, a sacrificial layer made of a flowable oxide (FOX) layer or a spin on glass (SOG) layer is formed on the support layer 550 to protect the recessed part of the support layer pattern 550b during the etchback process, and the sacrificial layer is removed after the etchback process is performed.

Referring to FIG. 6E, a photoresist pattern 560 is formed on the second side 512b of the substrate 512. The photoresist pattern 560 is formed on a border area, which limits a membrane area that will be formed on the membrane forming thin layer 520.

Referring to FIG. 6F, the substrate 512 is etched using the photoresist pattern 560 as the etching mask. Thereafter, only the sections of the substrate 512 corresponding to membrane areas 522 of the membrane forming thin layer 520 are removed, and main struts 512a which support the membrane area 522 on border areas 524 are formed by the remaining sections of the substrate 512.

Referring to FIG. 6G, after the photoresist pattern 560 is removed, an exposed portion of the oxide layer 514, the protection layer 540 and the hard mask pattern 532a are removed by a wet or dry etching method and the second side 520b of the membrane forming thin layer 520 is exposed via a planarizing process. As a result, each of the membrane areas 522 is respectively divided into a plurality of divided membrane areas 522a and 522b by the auxiliary strut, which includes the support layer pattern 550a and 550b formed on non-pattern areas of each of the membrane areas 522. A structure wherein the respective divided membrane areas 522a and 522b are supported by the auxiliary strut, which includes the support layer patterns 550a and 550b is obtained. The divided membrane areas 522a and 522b each include a pattern area in which a projected pattern is formed by particle beams. Here, the auxiliary strut which includes the support layer patterns 550a and 550b has a length $L_3$, from the first side 520a of the membrane forming thin layer 520, that is shorter than a length $L_4$ of the main strut 512a.

Referring to FIG. 6H, a photoresist pattern 570, which leaves part of the divided membrane areas 522a and 522b exposed, is formed on the second side 520b of the membrane forming thin layer 520.

Figure 6I:
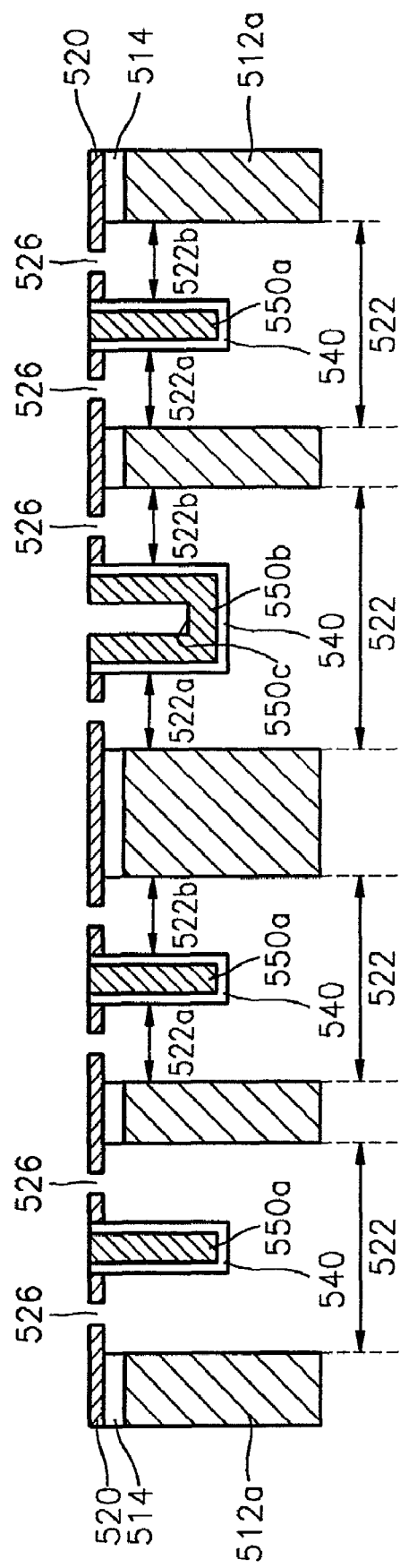

Referring to FIG. 6I, a plurality of apertures 526 which penetrate the membrane forming thin layer 520 are formed by etching the membrane forming thin layer 520 in the divided membrane areas 522a and 522b using the photoresist pattern 570 as the etching mask.

FIGS. 7A through 7I are cross-sections illustrating a method of manufacturing a stencil mask according to another embodiment of the present invention. The present embodiment is similar to the previous embodiment except an aperture penetrating the membrane forming thin layer is formed before an auxiliary strut is formed. Therefore, in the description of this embodiment, a detailed explanation of steps corresponding to the previous embodiment is omitted.

Referring to FIG. 7A, a composite layer 600 is prepared by sequentially layering a substrate 612, an oxide layer 614, and a membrane forming thin layer 620. In the event that the composite layer 600 is made of the SOI substrate, the substrate 612 is made of silicon and the membrane forming thin layer 620 is formed of a silicon thin film.

Thereafter, a plurality of membrane areas, which have pattern areas, and non-pattern areas in the membrane forming thin layer 620, and a border area limiting the membrane areas are formed. After forming a photoresist pattern 630 on the membrane forming thin layer 620, a plurality of apertures 626, which penetrate the membrane forming thin layer 620, are formed by etching the membrane forming thin layer 620 using the photoresist pattern 630 as the etching mask.

Referring to FIG. 7B, the photoresist pattern 630 is removed. Thereafter, a hard mask layer 632 made of a silicon nitride layer or a silicon oxide layer is formed inside the apertures 626 and on the membrane forming thin layer 620.

Figure 7C:
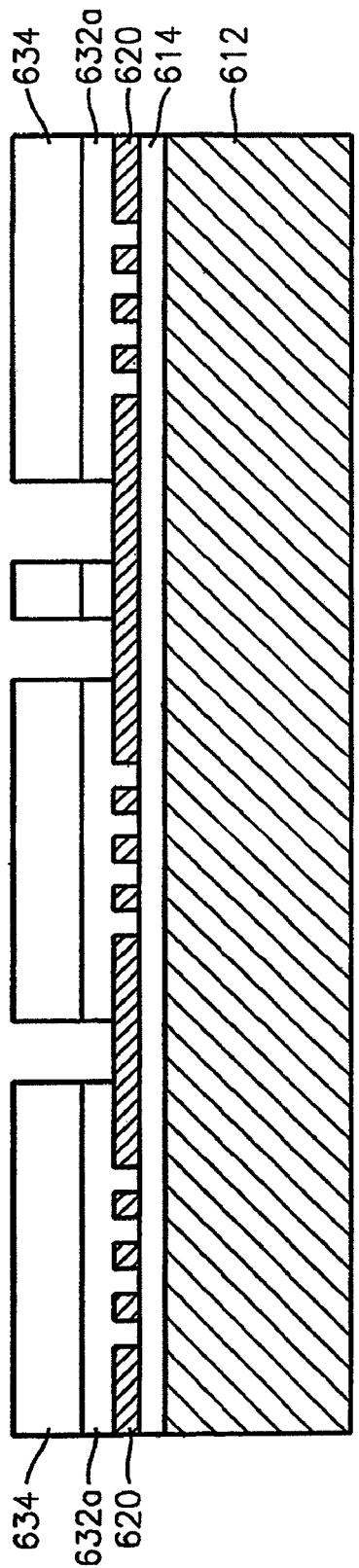

Referring to FIG. 7C, a photoresist pattern 634 is formed on the hard mask layer 632. The photoresist pattern 634 exposes the hard mask layer 632 through apertures having various widths ranging between about 10~100 μm. A hard mask pattern 632a which exposes sections of the non-pattern areas of the membrane forming thin layer 620 and simultaneously covers the pattern areas and the border areas is formed by etching the hard mask layer 632 using the photoresist pattern 634 as the etching mask.

Figure 7D:
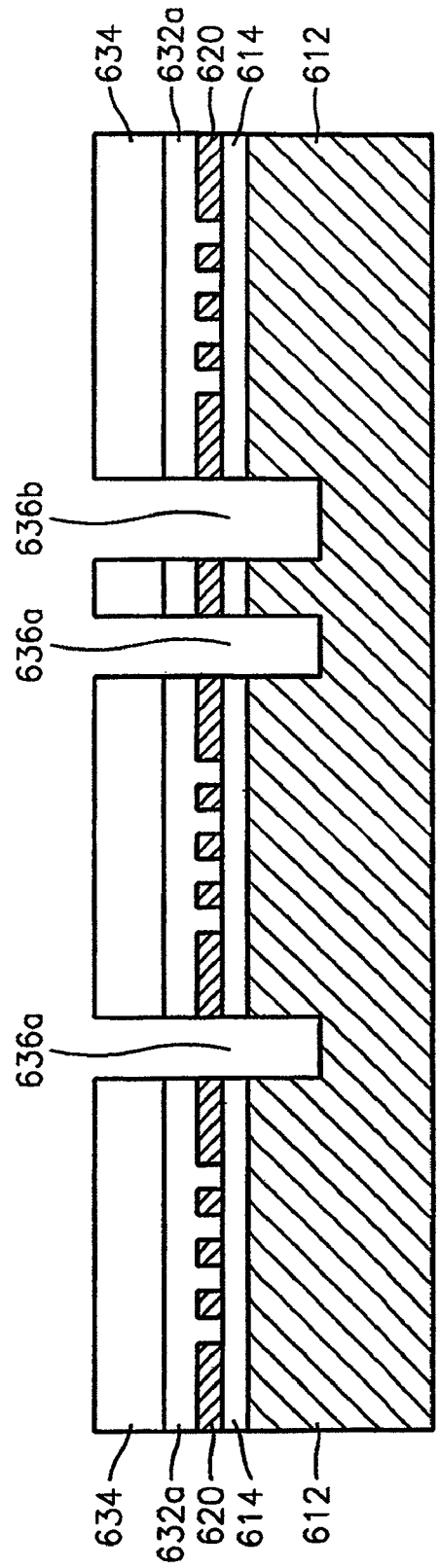

Referring to FIG. 7D, trenches 636a and 636b having various widths ranging between about 10~100 μm in the substrate 612 are formed by etching the membrane forming thin layer 620, the oxide layer 614, and the substrate 612 using the hard mask pattern 632a and the photoresist pattern 634 as the etching mask. The trenches 636a and 636b do not completely penetrate the substrate 612.

Referring to FIG. 7E, after removing the photoresist pattern 634, a protection layer 640 is formed on the inside walls of the trenches 636a and 636b and an upper surface of the hard mask pattern 632a, and a support layer 650 is formed on the protection layer 640 to fill the trenches 636a and 636b.

The protection layer 640 may be formed of a Ti layer, a TiN layer, a silicon nitride layer or a combination layer made of two or more of these three materials. The support layer 650 may be formed of a polisilicon layer, a TiN layer, a Ti layer, or a combination layer made of two or more of these three materials. In the case that the support layer 650 is made of a TiN layer, a Ti layer, or a combination thereof, the protection layer 640 may be omitted.

In addition, the trenches 636a that have a relatively small width are completely filled in by the support layer 650 and the trench 636b that has a relatively large width is partially filled in by the support layer 650.

Referring to FIG. 7F, support layer patterns 650a and 650b which form the auxiliary strut inside the trenches 636a and 636b are formed by removing the support layer 650 outside of the trenches 636a and 636b by a CMP or an etchback method. As a result, the support layer pattern 650a is formed to completely fill the inside of the trench 636a, which gives the auxiliary strut a columnar shape, and the support layer pattern 650b is formed with part of its surface 650c recessed, which gives the auxiliary strut a U-shape.

Referring to FIG. 7G, a photoresist pattern 660 is formed on a surface 612b of the substrate 612 which faces away from the membrane forming thin layer 620. The photoresist pattern 660 is formed on border areas which limit a membrane area that will be formed on the membrane forming thin layer 620.

Referring to FIG. 7H, the substrate 612 is etched using the photoresist pattern 660 as the etching mask. As a result, only the section of the substrate 612 corresponding to a membrane area 622 of the membrane forming thin layer 620 is removed and a main strut 612a which supports the membrane area 622 on the border area 624 remains.

Figure 7I:
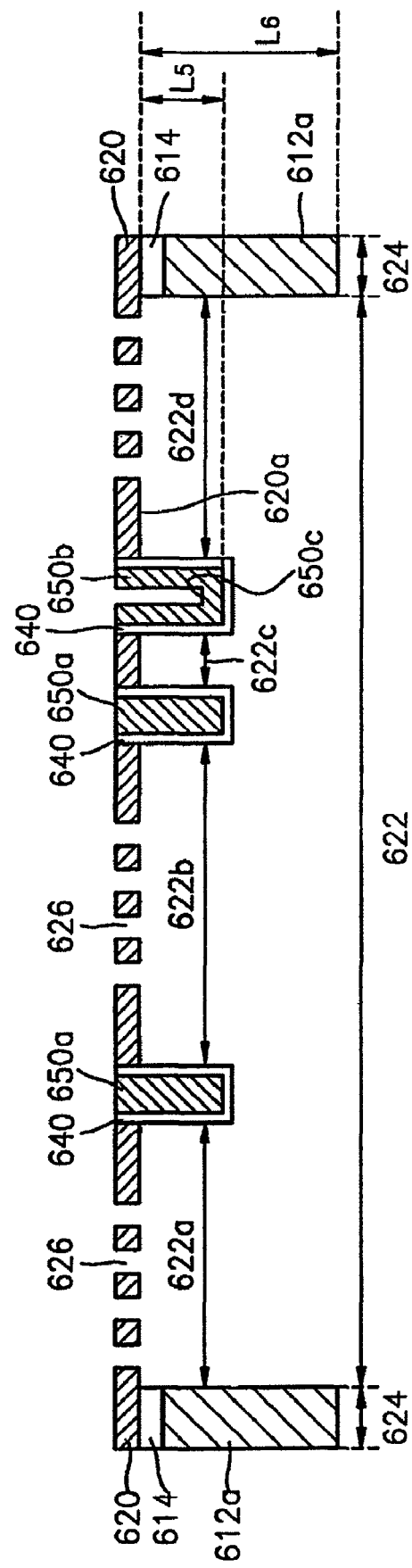

Referring to FIG. 7I, after removing the oxide layer 614, exposed sections of the protection layer 640, and the hard mask pattern 632a are removed by a wet or dry etching method and the membrane forming thin layer 620 is exposed by a planarizing process. As a result, the membrane area 622 is divided into a plurality of divided membrane areas 622a, 622b, 622c, and 622d by the auxiliary struts which include the support layer patterns 650a and 650b formed on the non-pattern areas of the membrane areas 622. The respective divided membrane areas 622a, 622b, 622c, and 622d are supported by the auxiliary struts which include the support layer pattern 550a and 550b. The respective divided membrane areas 622a, 622b, 622c, and 622d include apertures 626 of the pattern areas. The auxiliary strut formed of the support layer patterns 650a and 650b has a length $L_5$, from a first side 620a of the membrane forming thin layer 620, that is shorter than a length $L_6$ of the main strut 612a.

A stencil mask according to various exemplary embodiments of the present invention has various types of auxiliary struts placed inside membrane areas which are limited by a main strut. Moreover, the stencil mask according to exemplary embodiments of the present invention is particularly useful for patterning a locally densified pattern area such as a cell array area of a semiconductor memory device. Relatively large membrane areas are supported not only by a main strut, but also by an auxiliary strut formed in non-pattern areas. Accordingly, transformation or distortion of the membrane areas is prevented and image placement error can be minimized. A decline in the pattern's location precision can also be prevented.

Furthermore, the placement, width and length of an auxiliary strut can be designed in various ways according to the layout of the semiconductor memory or the logic device, for which the stencil mask is used. Thus, a customized stencil mask which fits various chip layouts can be manufactured without limitation in the shape and placement of the main strut and the size and aspect ratio of the membrane areas.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a stencil mask, the method comprising:
    (a) preparing a composite layer, the composite layer comprising:
        a membrane forming thin layer having a first side and a second side opposite the first side, the membrane forming thin layer comprising a plurality of membrane areas each having a plurality of pattern areas for forming a pattern to be projected by particle beams and non-pattern areas placed between each pattern area, the non-pattern areas including a border area limiting the membrane areas;
        a substrate having a first side facing the first side of the membrane forming thin layer and a second side opposite the first side; and
        an oxide layer interposed between the first side of the membrane forming thin layer and the first side of the substrate;
    (b) forming a trench by etching the composite layer in the non-pattern areas from the second side of the membrane forming thin layer;
    (c) forming an auxiliary strut by filling a support layer inside the trench; and
    (d) forming a main strut supporting the membrane area in the border area by removing sections of the substrate included in the membrane areas.

2. The method of claim 1, wherein the support layer is made of a material selected from the group consisting of a polisilicon layer, a TiN layer, a Ti layer, or a combination layer made of two or more of these three materials.

3. The method of claim 1, wherein the trench is completely filled by the support layer such that the auxiliary strut has a columnar shape.

4. The method of claim 1, wherein the support layer has a first surface exposed through the second side of the membrane forming thin layer, and part of the first surface of the support surface is recessed such that the auxiliary strut has a "U" shape.

5. The method of claim 1, wherein step (d) is performed after forming the auxiliary strut.

6. The method of claim 1, wherein step (c) further comprises:
    forming a protection layer on inside walls of the trench; and
    forming the support layer over the protection layer.

7. The method of claim 6, wherein the protection layer is made of a material selected from the group consisting of a Ti layer, a TiN layer, a silicon nitride layer, or a combination layer made of two or more of these three materials.

8. The method of claim 7, wherein the support layer is made of a polisilicon layer.

9. The method of claim 6, wherein the trench is completely filled by the support layer on the protection layer such that the auxiliary strut has a columnar shape.

10. The method of claim 6, wherein the support layer has a first surface exposed through the second side of the membrane forming thin layer and part of the first surface of the support layer is recessed such that the auxiliary strut has a "U" shape.

11. The method of claim 6, wherein step (d) further comprises removing the substrate and the oxide layer near the protection layer such that the membrane forming thin layer is exposed.

12. The method of claim 1, further comprising:
    (e) forming an aperture which penetrates the membrane forming thin layer to form a projected pattern on the pattern areas of the membrane areas.

13. The method of claim 12, wherein step (e) is performed after forming the main and auxiliary struts.

14. The method of claim 12, wherein step (e) is performed before forming the main and auxiliary struts.

15. A method of manufacturing a stencil mask, the method comprising:
    preparing a silicon on insulator (SOI) substrate by layering sequentially a substrate, an oxide layer and a silicon thin film;
    forming a first mask pattern over the silicon thin film;

forming a trench by etching the silicon thin film, the oxide layer, and the substrate using the first mask pattern as an etching mask;

forming an auxiliary strut by filling the trench with a support layer;

forming a second mask pattern on a surface of the substrate which is opposite a surface of the substrate which contacts the oxide layer;

forming a main strut which limits a membrane area of the silicon thin film by etching the substrate using the second mask pattern as an etching mask; and forming an aperture which penetrates the silicon thin film to form a projected pattern inside a pattern area limited by the auxiliary strut in the membrane area.

16. The method of claim 15, wherein the first mask pattern is formed of a hard mask pattern and a photoresist pattern covering the hard mask pattern.

17. The method of claim 15, wherein the substrate is etched in step (c) to a first depth that is less than the total thickness of the substrate.

18. The method of claim 15, wherein the support layer is made of a material selected from the group consisting of a polisilicon layer, a TiN layer, a Ti layer, or a combination layer made of two or more of these three materials.

19. The method of claim 15, wherein the trench is completely filled with the support layer such that the auxiliary strut has a columnar shape.

20. The method of claim 15, wherein the support layer has a first surface exposed through the silicon thin film, and part of the first surface is recessed such that the auxiliary strut has a "U" shape.

21. The method of claim 15, wherein step (d) further comprises:

forming a protection layer on inside walls of the trench; and forming the support layer over the protection layer.

22. The method of claim 21, wherein the support layer is made of a material selected from the group consisting of a Ti layer, a TiN layer, a silicon nitride layer, or a combination layer made of two or more of these three materials.

23. The method of claim 22, wherein the support layer is made of a polisilicon layer.

24. The method of claim 21, wherein the trench is completely filled by the support layer on the protection layer such that the auxiliary strut has a columnar shape.

25. The method of claim 21, wherein the support layer has a first surface exposed through the silicon thin film and part of the first surface is recessed such that the auxiliary strut has a "U" shape.

26. A method of manufacturing a stencil mask, the method comprising:

(a) preparing a silicon on insulator (SOI) substrate by layering sequentially a substrate, an oxide layer, and a silicon thin film;

(b) arranging a border area which limits plural membrane areas that have pattern areas and non-pattern areas placed between the pattern areas in the silicon thin film;

(c) forming an aperture which penetrates the silicon thin film to form a projected pattern in the pattern areas;

(d) forming a first mask pattern which covers the pattern areas having the aperture and the border area and exposes the silicon thin film in the non-pattern areas;

(e) forming a trench by etching the silicon thin film, the oxide layer and the substrate using the first mask pattern as an etching mask, in the non-pattern areas;

(f) forming an auxiliary strut by filling the trench with a support layer;

(g) forming a second mask pattern on a surface of the substrate which is opposite to a surface of the substrate which contacts the oxide layer; and (h) forming a main strut which limits the membrane areas in the border area by etching the substrate using the second mask pattern as an etching mask.

27. The method of claim 26, wherein the first mask pattern is made of a hard mask pattern and a photoresist pattern covering the hard mask pattern.

28. The method of claim 26, wherein the substrate is etched in step (e) to a first depth that is less than the total thickness of the substrate.

29. The method of claim 26, wherein the support layer is made of a material selected from the group consisting of a polisilicon layer, a TiN layer, a Ti layer, or a combination layer made of two or more of these three materials.

30. The method of claim 26, wherein the trench is completely filled by the support layer such that the auxiliary strut has a columnar shape.

31. The method of claim 26, wherein the support layer has a first surface exposed through the silicon thin film and part of the first surface is recessed such that the auxiliary strut has a "U" shape.

32. The method of claim 26, wherein step (f) further comprises:

forming a protection layer on inside walls of the trench; and forming the support layer over the protection layer.

33. The method of claim 32, wherein the protection layer is made of a material selected from the group consisting of a Ti layer, a TiN layer, a silicon nitride layer, or a combination layer made of two or more of these three materials.

34. The method of claim 33, wherein the support layer is made of a polisilicon layer.

35. The method of claim 32, wherein the trench is completely filled by the support layer on the protection layer such that the auxiliary strut has a columnar shape.

36. The method of claim 32, wherein the support layer has a first surface exposed through the silicon thin film and part of the first surface is recessed such that the auxiliary strut has a "U" shape.

* * * * *